United States Patent
Ahn et al.

(10) Patent No.: US 8,107,904 B2
(45) Date of Patent: Jan. 31, 2012

(54) APPARATUS AND METHOD FOR POWER TRANSMITTER IN WIRELESS COMMUNICATION SYSTEM

(75) Inventors: Cheol-Woo Ahn, Suwon-si (KR);
Keun-Hyo Song, Seongnam-si (KR);
Cheol-Soo Seo, Suwon-si (KR);
Young-Yoon Woo, Suwon-si (KR);
Bum-Man Kim, Pohang-si (KR); Il-Du Kim, Pohang-si (KR)

(73) Assignees: Samsung Electronics Co., Ltd., Suwon-si (KR); Postech Foundation, Pohang-si (KR)

( * ) Notice: Subject to any disclaimer, the term of this patent is extended or adjusted under 35 U.S.C. 154(b) by 417 days.

(21) Appl. No.: 12/391,774

(22) Filed: Feb. 24, 2009

(65) Prior Publication Data
US 2009/0215413 A1 Aug. 27, 2009

(30) Foreign Application Priority Data
Feb. 26, 2008 (KR) .................. 10-2008-0017355

(51) Int. Cl.
*H01Q 11/12* (2006.01)

(52) U.S. Cl. .................... 455/127.2; 455/127.1
(58) Field of Classification Search .......... 455/115.1, 455/127.1, 127.2, 127.3
See application file for complete search history.

(56) References Cited

U.S. PATENT DOCUMENTS
7,560,984 B2 * 7/2009 Akizuki et al. .......... 330/136
* cited by examiner

*Primary Examiner* — Hai L Nguyen
(74) *Attorney, Agent, or Firm* — Jefferson IP Law, LLP

(57) ABSTRACT

An apparatus and a method for an Envelope Elimination and Restoration (EER) power transmitter are provided. The apparatus includes a signal separator for splitting a transmit signal to an amplitude component and a phase component, an orthogonal modulator for modulating the phase component into a Radio Frequency (RF) signal, a bias modulator for linearly amplifying the amplitude component, for determining a bias voltage according to a magnitude of the amplitude component, and for providing a current generated using the determined bias voltage to a high-efficiency power amplifier and the high-efficiency power amplifier for amplifying the RF signal using the linearly amplified amplitude component as a drain bias voltage and using the generated current as a drain bias current.

18 Claims, 9 Drawing Sheets

DOTTED LINE : SWITCHING REGULATOR
OUTPUT CURRENT(700)
SOLID LINE : LINEAR AMPLITUDE
AMPLIFIER OUTPUT CURRENT(710)
FINE LINE : POWER AMPLIFIER DRAIN CURRENT(720)

SWITCHING REGULATOR
OF TWO-STEP
BIAS OF 0 AND $V_{ds}$

SWITCHING REGULATOR
HAVING MULTIPLE
BIASES DIVIDED

APPARATUS AND METHOD FOR POWER TRANSMITTER IN WIRELESS COMMUNICATION SYSTEM

PRIORITY

This application claims the benefit under 35 U.S.C. §119 (a) of a Korean patent application filed in the Korean Intellectual Property Office on Feb. 26, 2008 and assigned Serial No. 10-2008-0017355, the entire disclosure of which is hereby incorporated by reference.

JOINT RESEARCH AGREEMENT

The presently claimed invention was made by or on behalf of the below listed parties to a joint research agreement. The joint research agreement was in effect on or before the date the claimed invention was made and the claimed invention was made as a result of activities undertaken within the scope of the joint research agreement. The parties to the joint research agreement are Samsung Electronics Co. Ltd. and Postech Foundation.

BACKGROUND OF THE INVENTION

1. Field of the Invention

The present invention relates generally to an apparatus and a method for a power transmitter in a wireless communication system. More particularly, the present invention relates to an apparatus and a method for an Envelope Elimination and Restoration (EER) power transmitter in a wireless communication system.

2. Description of the Related Art

As wireless communication systems are advancing in accordance with advances in communication technologies, the amount of data transmitted by a wireless communication system and the transmission rate of the data are increasing. Furthermore, with the increased data and transmission rate, a bandwidth of a signal to transmit is widened and a Peak to Average Power Ratio (PAPR) increases. Accordingly, the importance of a high-performance transmitter having high efficiency and high linearity is growing in the wireless communication system.

However, since the efficiency and the linearity of a conventional power transmitter are inversely related, it is difficult to meet both the efficiency and the linearity demands of the communication system using the conventional power transmitter.

To address this problem, research is being conducted on an Envelope Elimination and Restoration (EER) power transmitter. The EER power transmitter modulates a phase component, from which an amplitude component is removed from the signal to be amplified to a Radio Frequency (RF) signal, and amplifies the modulated signal as shown in FIG. 1. This method achieves high-efficiency amplification with a reduction in distortion of the amplifier.

FIG. 1 depicts a conventional EER power transmitter.

The EER power transmitter of FIG. 1 includes a signal separator 100, a bias modulator 110, an orthogonal modulator 120, and a high-efficiency power amplifier 130.

The signal separator 100 separates an amplitude component and a phase component of the signal to be amplified. The signal separator 100 outputs the amplitude component to the bias modulator 110 and outputs the phase component to the orthogonal modulator 120.

The bias modulator 110 amplifies the amplitude component fed from the signal separator 100 and outputs the amplified amplitude component to the high-efficiency power amplifier 130. The bias modulator 110 includes a linear amplitude amplifier (not shown) and a switching regulator (not shown).

The orthogonal modulator 120 modulates the phase component fed from the signal separator 110 into an RF signal.

The high-efficiency power amplifier 130 amplifies the RF signal output from the orthogonal modulator 120 using the signal output from the bias modulator 110 as the drain bias. By merely amplifying the phase component output from the orthogonal modulator 120, the high-efficiency power amplifier 130 can reduce the distortion of the amplifier. In addition, using the amplified amplitude component provided from the bias modulator 110 as the drain bias, the high-efficiency power amplifier 130 can restore the amplitude component of the signal to be amplified.

As stated above, the EER power amplifier amplifies only the phase component using the amplitude component of the transmit signal as the bias voltage, to thus attain high efficiency and high linearity of the power transmitter.

To address both the efficiency and linearity in an EER power amplifier, the bias modulator should be able to accommodate the wide bandwidth and the high PAPR of the amplitude component. In other words, the bias modulator needs to accommodate a rapid change of a slew rate with high efficiency.

However, the switching regulator, which is the main power source of the bias modulator, cannot supply the current corresponding to the wide change of the slew rate. Accordingly, since the bias modulator provides the current to the high-efficiency power amplifier by increasing the current transfer rate of the linear amplitude amplifier that has lower efficiency than the switching regulator, there is a limitation in improving the total efficiency of the EER power transmitter.

Accordingly, there is a need for an improved apparatus and a method that enhances efficiency of a bias modulator in an EER power transmitter.

SUMMARY OF THE INVENTION

An aspect of the present invention is to address at least the above mentioned problems and/or disadvantages and to provide at least the advantages described below. Accordingly, an aspect of the present invention is to provide an apparatus and a method for enhancing efficiency of a bias modulator in an Envelope Elimination and Restoration (EER) power transmitter.

Another aspect of the present invention is to provide an apparatus and a method for increasing a ratio of a current provided from a switching regulator to a high-efficiency power amplifier in a bias modulator of an EER power transmitter.

Yet another aspect of the present invention is to provide an apparatus and a method for changing a bias voltage of a switching regulator based on a magnitude detected from an amplitude component so that the switching regulator attains a broad slew rate in an EER power transmitter.

According to an aspect of the present invention, an apparatus for an EER power transmitter is provided. The apparatus includes a signal separator for splitting a transmit signal into an amplitude component and a phase component, an orthogonal modulator for modulating the phase component into a Radio Frequency (RF) signal, a bias modulator for linearly amplifying the amplitude component, for determining a bias voltage according to a magnitude of the amplitude component, and for providing a current generated using the determined bias voltage to a high-efficiency power amplifier and the high-efficiency power amplifier for amplifying the RF signal using the linearly amplified amplitude component as a drain bias voltage and using the generated current as a drain bias current.

According to another aspect of the present invention, a signal transmission method of an EER power transmitter is provided. The method includes splitting a transmit signal to an amplitude component and a phase component, modulating the phase component into an RF signal, linearly amplifying the amplitude component, generating a current to be used for amplifying the RF signal with a bias voltage determined by a magnitude of the amplitude component and amplifying the RF signal using the linearly amplified amplitude component as a drain bias voltage and using the generated current as a drain bias current.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments the present invention will be more apparent from the following description taken in conjunction with the accompanying drawings, in which.

Throughout the drawings, it should be noted that like reference numbers are used to depict the same or similar elements, features and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Exemplary embodiments of the present invention provide a technique for enhancing efficiency of a bias modulator in an Envelope Elimination and Restoration (EER) power transmitter.

The bias modulator of the EER power transmitter includes a linear amplitude amplifier and a switching regulator. The switching regulator exhibits a high efficiency characteristic and the linear amplitude amplifier exhibits a low efficiency characteristic.

Accordingly, the bias modulator can enhance its efficiency by increasing a ratio of the current supplied from the switching regulator to a high-efficiency amplifier and decreasing a ratio of the current supplied from the linear amplitude amplifier to the high-efficiency amplifier.

For doing so, the bias modulator needs to constitute the switching regulator so as to support a slew rate desired by the high-efficiency power transmitter. For example, the bias modulator controls the bias voltage of the switching regulator based on a magnitude of an amplitude component as shown in FIG. 2.

Figure 1:
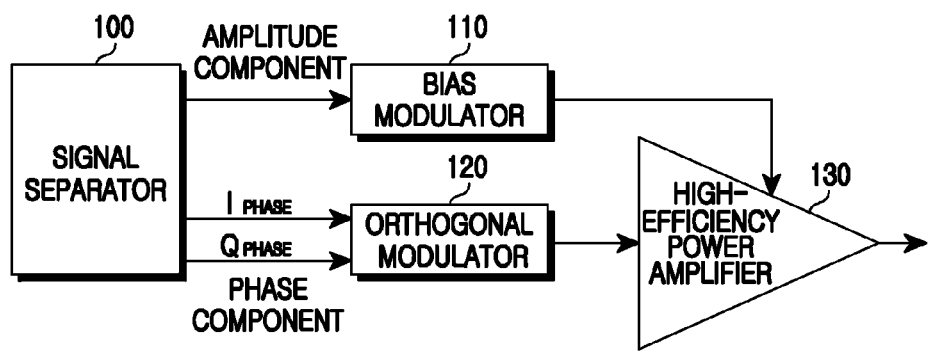
FIG. 1 illustrates a conventional Envelope Elimination and Restoration (EER) power transmitter.
Figure 2:
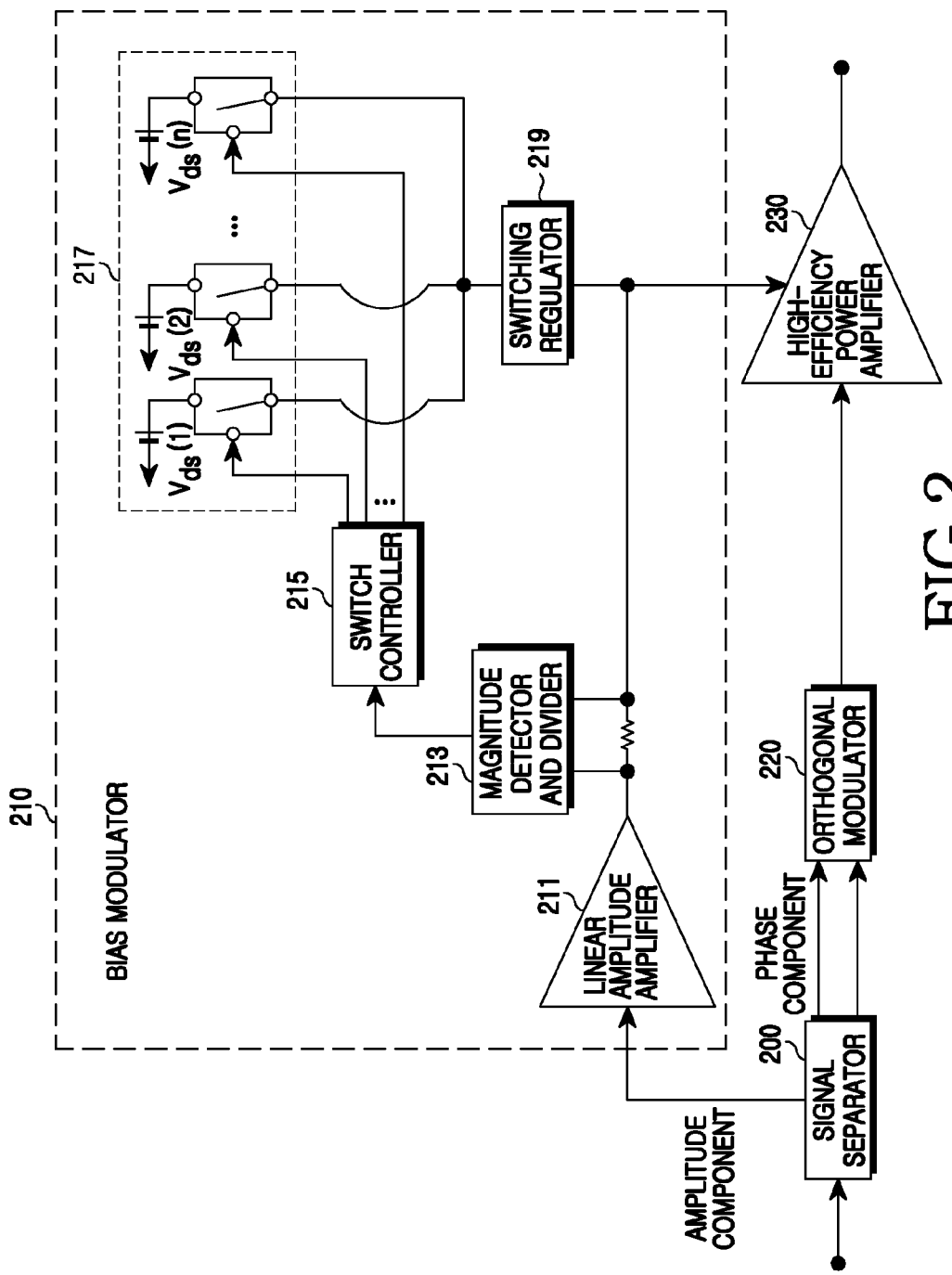
FIG. 2 illustrates an EER power transmitter according to an exemplary embodiment of the present invention.

FIG. 2 is a block diagram of an EER power transmitter according to an exemplary embodiment of the present invention.

The EER power transmitter of FIG. 2 includes a signal separator 200, a bias modulator 210, an orthogonal modulator 220, and a high-efficiency power amplifier 230.

The signal separator 200 separates an amplitude component and a phase component of a signal to be amplified. The signal separator 200 sends the amplitude component to the bias modulator 210 and outputs the phase component to the orthogonal modulator 220.

The bias modulator 210 amplifies the amplitude component output from the signal separator 200 and outputs the amplified amplitude component to the drain bias voltage of the high-efficiency power amplifier 230. For example, the bias modulator 210 includes a linear amplitude amplifier 211, a magnitude detector and divider 213, a switch controller 215, a bias power 217, and a switching regulator 219.

The linear amplitude amplifier 211 linearly amplifies the amplitude component fed from the signal separator 200.

The magnitude detector and divider 213 amplifies the magnitude of a signal voltage-dropped by a resistor serially connected to the output stage of the linear amplitude amplifier 211 and divides the magnitude of the amplitude component fed from the signal separator 200 based on a plurality of voltage levels. Herein, as the current supplied by the linear amplitude amplifier 211 increases, the voltage reduction by the resistor increases. In contrast, when the linear amplitude amplifier 211 supplies less current or the switching regulator 219 supplies unnecessary current, the voltage reduction decreases.

Next, the magnitude detector and divider 213 generates a control signal to control the bias power 217 based on the divided voltage level. An exemplary magnitude detector and divider 213 will be shown below with reference to FIG. 3.

The switch controller 215 connects one or more of a plurality of power devices of the bias power 217, based on the magnitude of the amplitude component, to the switching regulator 219 according to the control signal output from the magnitude detector and divider 213. Since the switch controller 215 controls the switch connected to the voltage devices, it can reduce a switching loss by lowering the switching speed.

The bias power 217 includes the plurality of power devices having different bias voltages. Of course, the bias voltages may differ from each other by a consistent amount or may differ from each other by a varying amount.

The switching regulator 219 generates the current to be supplied to the high-efficiency power amplifier 230 using the bias voltage fed from the voltage device connected under the control of the switch controller 215. As the bias voltage is fed according to the magnitude of the amplitude component, the switching regulator 219 can regulate the change of the slew rate of the output current. Thus, the switching regulator 219 can address the issue of unnecessary current caused by a ripple effect when a smaller inductor is designed to increase the slew rate.

The orthogonal modulator 220 modulates the phase component output from the signal separator 200 into an RF signal.

The high-efficiency power amplifier 230 amplifies the RF signal output from the orthogonal modulator 220 using the signal fed from the bias modulator 210 as the drain bias. In more detail, the high-efficiency power amplifier 230 amplifies the RF signal using the amplitude component linearly amplified by the linear amplitude amplifier 211 of the bias modulator 210 as the drain bias voltage and using the current generated by the switching regulator 219 as the drain bias current. Herein, the high-efficiency power amplifier 230 represents all kinds of the switching and saturation high-efficiency power amplifier including class D, class E, class F, class J, class E/F series, class J/E, inverting class D, and inverting class F.

As stated above, the switching regulator 219 can support the slew rate of the current as desired by the high-efficiency power amplifier 230 by supplying the drain bias current of the high-efficiency power amplifier 230 using the bias voltage based on the magnitude of the amplitude component.

Figure 3:
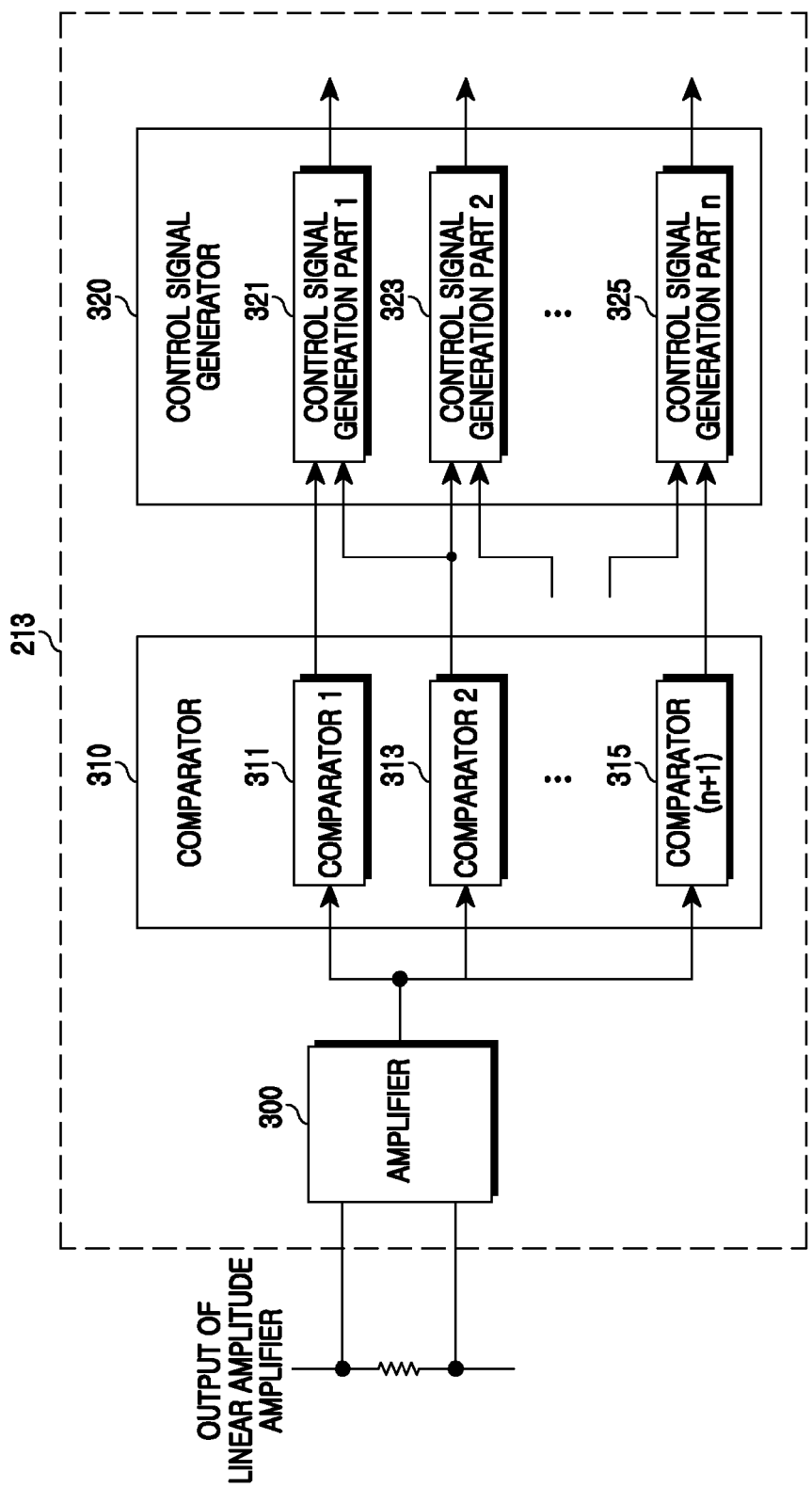
FIG. 3 illustrates a magnitude detector and divider of an EER power transmitter according to an exemplary embodiment of the present invention.

The magnitude detector and divider 213, which examines the magnitude of the amplitude component, may be constructed as shown in FIG. 3.

FIG. 3 is a block diagram of a magnitude detector and divider of an EER power transmitter according to an exemplary embodiment of the present invention.

The magnitude detector and divider 213 of FIG. 3 includes an amplifier 300, a comparator 310, and a control signal generator 320.

The amplifier 300 amplifies the signal voltage-reduced by the resistor serially connected to the output stage of the linear amplitude amplifier 211 and outputs the amplified signal to the comparator 310.

The comparator 310 divides the magnitude of the amplitude component into a plurality of different voltage levels using a plurality of hysteresis comparators 311 through 315, each hysteresis comparator having a hysteresis value that does not overlap with another. Herein, the comparator 310 includes a number of hysteresis comparators that is greater than the number of voltage devices of the bias power 217 by one.

In an exemplary implementation, each of the hysteresis comparators 311 through 315 operate when the input signal is greater than or equal to the hysteresis corresponding to the respective hysteresis comparator. For example, if the comparator 310 includes three hysteresis comparators and the respective hysteresis of the hysteresis comparators is 1~2V, 3~4V, and 5~6V in order, when the input signal momentarily swings from 0V to 4.5V, the first hysteresis comparator and the second hysteresis comparator output '1' and the third hysteresis comparator outputs '0'. In this situation, the interval of the output '1' of the second hysteresis comparator is smaller than the interval of the output '1' of the first hysteresis comparator.

The control signal generator 320 includes control signal generation parts 321 through 325. There are as many control signal generation parts as there are voltage devices of the bias power 217. Herein, each of the control signal generation parts 321 through 325 are respectively connected to one voltage device and control the connection between the voltage device and the switching regulator 219.

The control signal generation parts 321 through 325 control to connect the corresponding voltage device to the switching regulator 219. To determine if a connection is to be made between the corresponding voltage device and the switching regulator 219, each of the control signal generation parts 321 through 325 performs a logical operation on the output signals of two consecutive hysteresis comparators of the comparator 310. In an exemplary implementation, the logical operation is an Exclusive OR (XOR) operation. For example, the first control signal generation part 321 may control the connection of a first voltage device having the lowest bias voltage in the bias power 217 through an XOR operation of the output signals from the first hysteresis comparator 311 and the second hysteresis comparator 313. Similarly, the second control signal generation part 323 controls the connection of the second voltage device having the second lowest bias voltage in the bias power 217 through an XOR operation of the output signals from the second hysteresis comparator 313 and the third hysteresis comparator.

As such, the bias modulator of the EER power transmitter regulates the bias voltage of the switching regulator based on the magnitude of the amplitude component to address the broad slew rate. For example, the bias modulator controls the bias voltage of the switching regulator as illustrated in FIG. 4.

FIG. 4 illustrates a bias variation of a switching regulator in an EER power transmitter according to an exemplary embodiment of the present invention.

Figure 4A:
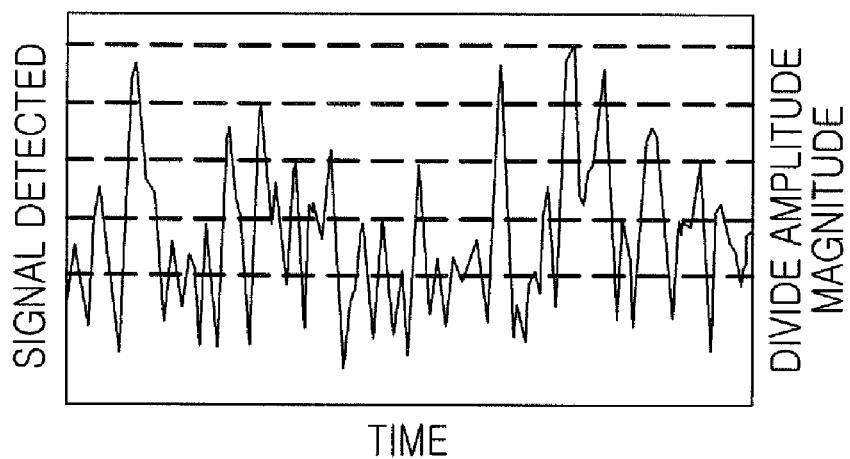
FIG. 4 illustrates a bias change of a switching regulator in an EER power transmitter according to an exemplary embodiment of the present invention.
Figure 4B:
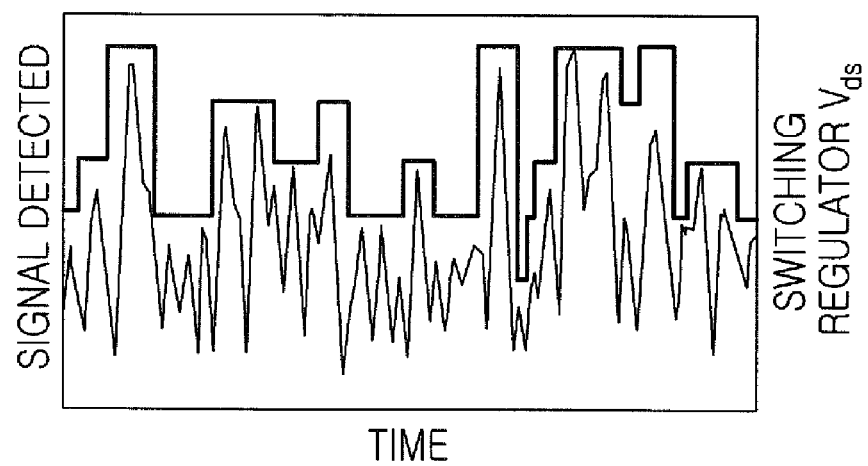

FIG. 4A illustrates the magnitude of the amplitude component and FIG. 4B illustrates the bias voltage fed to the switching regulator based on the magnitude of the amplitude component.

In FIG. 4A, the magnitude detector and divider 213 divides the magnitude of the amplitude component, separated by the signal separator 200, into the plurality of the voltage levels.

Next, the magnitude detector and divider 213 controls to connect the voltage device of the bias power 217 corresponding to the magnitude of the amplitude component to the switching regulator 219.

Hence, the switching regulator 219 receives the bias voltage according to the magnitude of the amplitude component as shown in FIG. 4B and generates the current to be supplied to the high-efficiency power amplifier 230.

Now, descriptions explaining exemplary methods for controlling the bias voltage of the switching regulator based on the magnitude of the amplitude component for the broad slew rate in the bias modulator of the EER power transmitter are provided.

Figure 5:
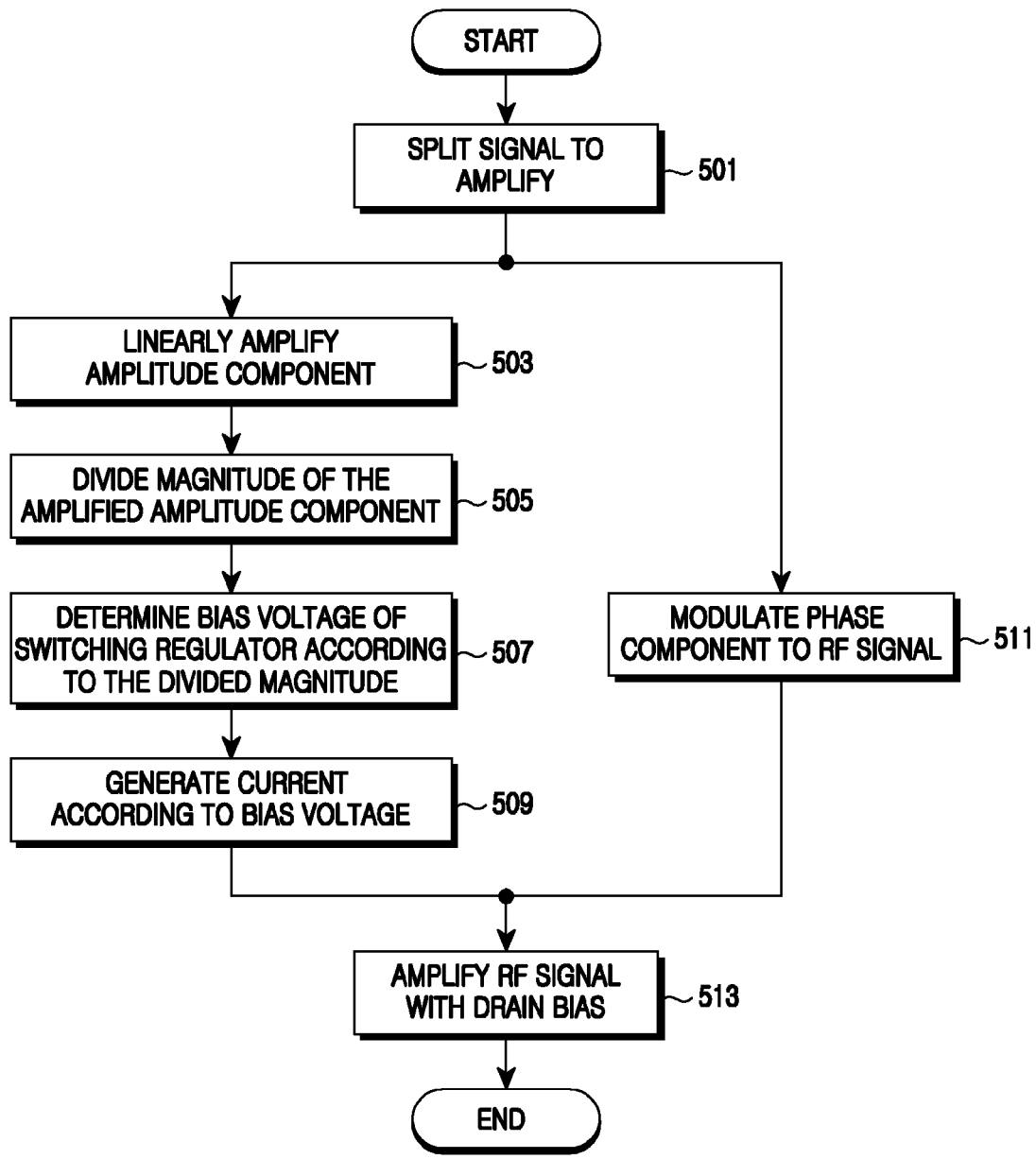
FIG. 5 illustrates a method for changing a bias of a switching regulator based on an amplitude magnitude in an EER power transmitter according to an exemplary embodiment of the present invention.

FIG. 5 is a flowchart outlining a method for changing a bias of a switching regulator based on an amplitude magnitude in an EER power transmitter according to an exemplary embodiment of the present invention.

In step 501, the EER power transmitter splits the signal to be amplified into an amplitude component and a phase component.

In step 503, the EER power transmitter linearly amplifies the amplitude component separated in step 501.

In step 505, the EER power transmitter divides the magnitude of the linearly amplified amplitude component into the plurality of voltage levels. For example, the EER power transmitter divides the magnitude of the amplitude component by the magnitude of the bias voltage that can be provided by the bias power 217 of FIG. 2.

In step 507, the EER power transmitter determines the bias voltage to be supplied to the switching regulator according to the magnitude of the divided amplitude component. For example, the EER power transmitter selects the power device which supplies the bias voltage according to the divided magnitude in the bias power 217, and connects the selected power device to the switching regulator.

In step 509, the EER power transmitter generates the current according to the bias voltage using the switching regulator.

After splitting the signal to amplify to the amplitude component and the phase component in step 501, the EER power transmitter modulates the phase component separated in step 501, to the RF signal in step 511.

In step 513, the EER power transmitter amplifies the RF signal using the linearly amplified amplitude component as the drain bias. More particularly, the high-efficiency power amplifier of the EER power transmitter amplifies the RF signal using the linearly amplified amplitude component as the drain bias voltage and using the current generated with the bias voltage determined by the magnitude of the amplitude component as the drain bias current.

Next, the EER power transmitter finishes this process.

As above, when the bias voltage of the switching regulator is controlled based on the magnitude of the amplitude component, a delay may be generated in the feedback loop from the magnitude detector and divider 213 to the switching regulator 219. To address the delay, the EER power transmitter may be constituted as illustrated in FIG. 6.

Figure 6:
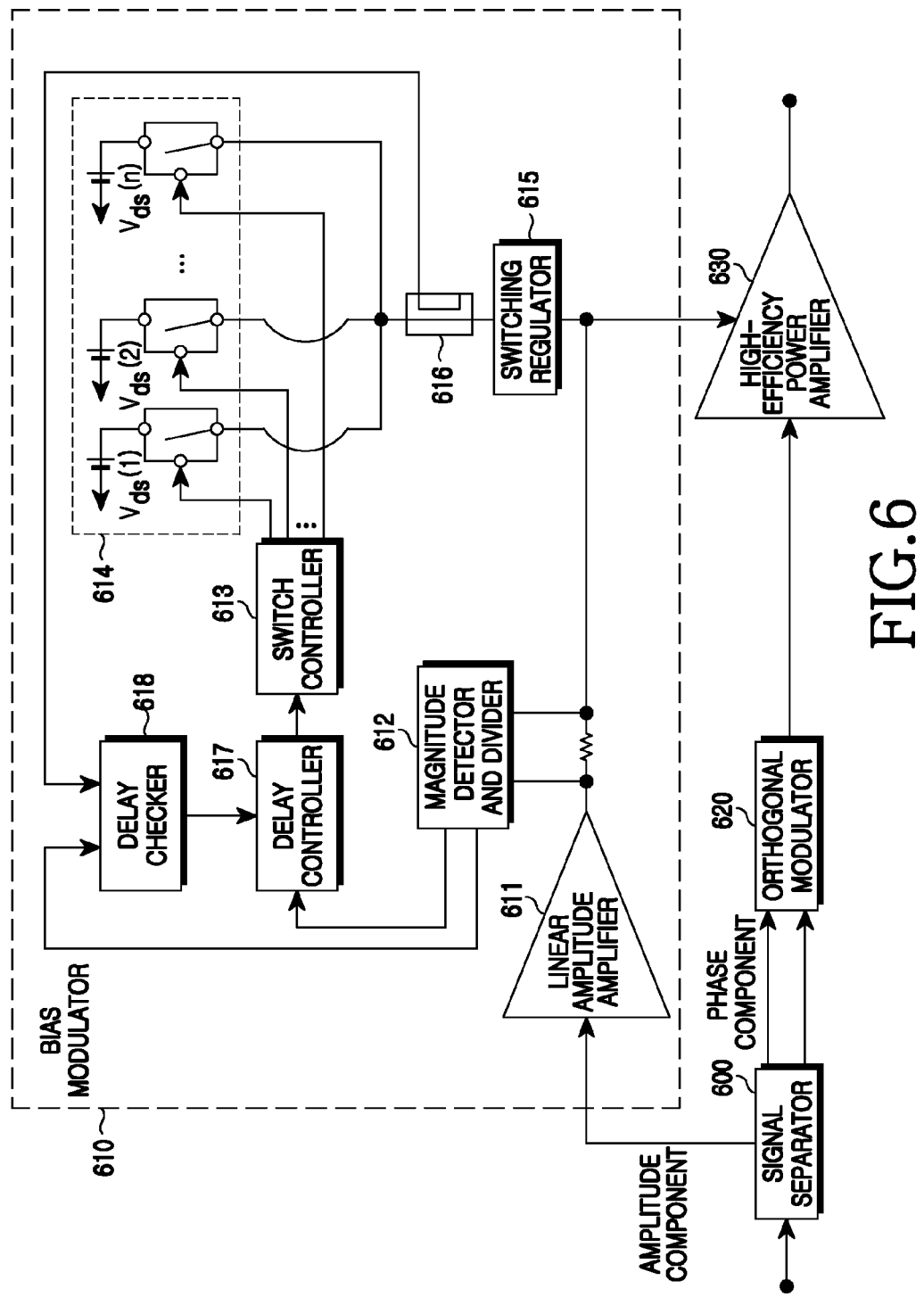
FIG. 6 illustrates an EER power transmitter according to an exemplary embodiment of the present invention.

FIG. 6 is a block diagram of an EER power transmitter according to an exemplary embodiment of the present invention.

The EER power transmitter of FIG. 6 includes a signal separator 600, a bias modulator 610, an orthogonal modulator 620, and a high-efficiency power amplifier 630.

The signal separator 600 separates the amplitude component and the phase component of a signal to be amplified. The signal separator 600 sends the amplitude component to the bias modulator 610 and outputs the phase component to the orthogonal modulator 620.

The bias modulator 610 amplifies the amplitude component output from the signal separator 600 and outputs the amplified amplitude component to the drain bias voltage of the high-efficiency power amplifier 630. For example, the bias modulator 610 includes a linear amplitude amplifier 611, a magnitude detector and divider 612, a switch controller 613, a bias power 614, a switching regulator 615, a feedback part 616, a delay controller 617, and a delay checker 618.

The linear amplitude amplifier 611 amplifies the amplitude component fed from the signal separator 600.

The magnitude detector and divider 612 amplifies the signal voltage-dropped by a resistor serially connected to the output stage of the linear amplitude amplifier 611 and divides the magnitude of the amplitude component fed from the signal separator 600 based on a plurality of voltage levels.

Next, the magnitude detector and divider 612 generates a control signal to control the bias power 614 based on the divided voltage level.

The switch controller 613 connects one of power devices of the bias power 614, based on the magnitude of the amplitude component, to the switching regulator 615 according to the control signal provided from the magnitude detector and divider 612. Since the switch controller 613 controls the switch connected to the voltage devices, it can reduce the switching loss by lowering the switching speed.

The bias power 614 includes a plurality of power devices having different bias voltages.

The switching regulator 615 generates the current to be supplied to the high-efficiency power amplifier 630 using the bias voltage fed from the voltage device connected under the control of the switch controller 613. As the bias voltage is supplied according to the magnitude of the amplitude component, the switching regulator 615 can control the change of the slew rate of the output current. Thus, the switching regulator 615 can address an unnecessary current caused by a ripple effect when a smaller inductor is designed to increase the slew rate.

The feedback part 616 detects the output of the bias modulator 610 to check for a delay and provides the detected output to the delay checker 618.

The delay checker 618 determines the delay time by comparing the signal fed from the magnitude detector and divider 612 with the signal fed from the feedback part 616.

The delay controller 617 compensates for the delay confirmed by the delay checker 618.

The orthogonal modulator 620 modulates the phase component output from the signal separator 600 to an RF signal.

The high-efficiency power amplifier 630 amplifies the RF signal output from the orthogonal modulator 620 using the signal fed from the bias modulator 610 as the drain bias. In more detail, the high-efficiency power amplifier 630 amplifies the RF signal using the amplitude component linearly amplified by the linear amplitude amplifier 611 of the bias modulator 610 as the drain bias voltage and using the current generated by the switching regulator 615 as the drain bias current.

When the bias modulator of the EER power transmitter controls the input bias voltage of the switching regulator based on the magnitude of the amplitude component, the performance change is now illustrated.

Figure 7A:
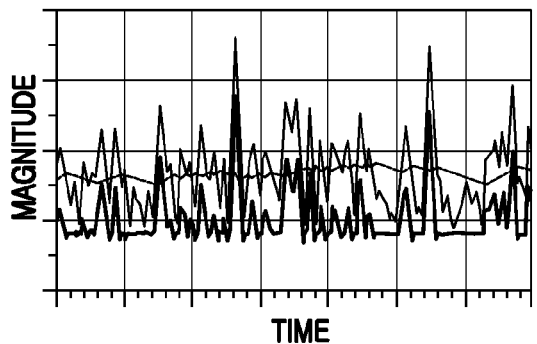
FIG. 7 illustrates a performance change of an EER power transmitter according to an exemplary embodiment of the present invention.
Figure 7B:
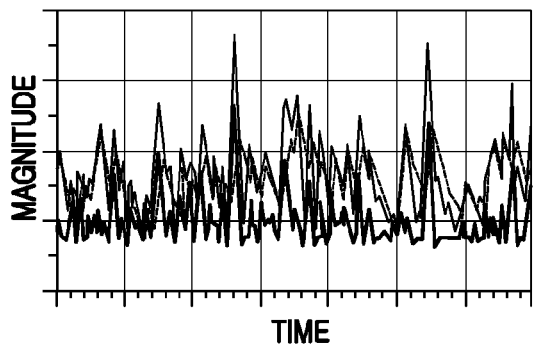

FIGS. 7A and 7B are graphs showing the performance change of an EER power transmitter according to an exemplary embodiment of the present invention. Herein, to examine the performance change, it is assumed that the EER power transmitter uses a mobile WiMAX amplitude signal of the Institute of Electrical and Electronics Engineers (IEEE) 802.16e standard with a 10 MHz band and that the Peak to Average Power Ratio (PAPR) is 8 dB with a Crest Factor Reduction (CFR) adopted.

FIG. 7A shows the output current of the bias modulator when a constant bias voltage is applied to the switching regulator, and FIG. 7B shows the output current of the bias modulator when the bias voltage of the switching regulator is controlled based on the magnitude of the amplitude component according to an exemplary embodiment of the present invention.

When the bias modulator supplies the two-step bias voltage of zero (0) and Vds to the switching regulator according to the magnitude of the amplitude signal, the slew rate of the output current 700 of the switching regulator does not significantly change as shown in FIG. 7A. Hence, the bias modulator utilizes the output current 710 of the linear amplitude amplifier to meet the slew rate of the current 720 desired by the high-efficiency power amplifier. In so doing, because the linear amplitude amplifier having low efficiency consumes a large amount of power, the entire efficiency of the bias modulator deteriorates.

When the bias modulator supplies the divided bias voltages to the switching regulator according to the magnitude of the amplitude signal, the slew rate of the output current 700 of the switching regulator significantly changes as shown in FIG. 7B. Thus, the bias modulator utilizes the output current 700 of the switching regulator to meet the slew rate of the current 720 desired by the high-efficiency power amplifier. If the output current 700 of the switching regulator is insufficient, the bias modulator supplies the current 720 desired by the high-efficiency power amplifier by additionally using the output current 710 of the linear amplitude amplifier.

As mentioned above, when the bias modulator supplies the divided bias voltages to the switching regulator and increases the slew rate change of the current, the current consumption can be reduced as shown in FIG. 8.

FIG. 8 is a graph showing the performance change of an EER power transmitter according to an exemplary embodiment of the present invention.

Figure 8B:
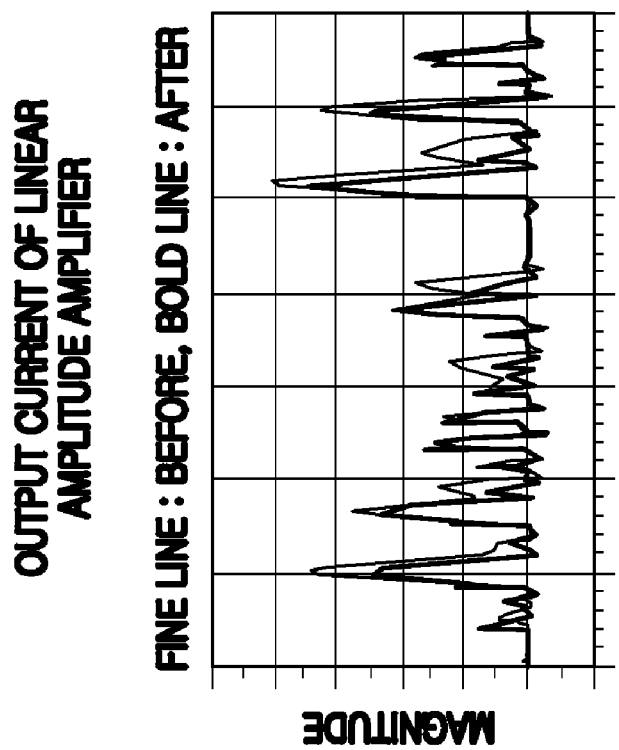
FIG. 8 illustrates a performance change of an EER power transmitter according to an exemplary embodiment of the present invention.
Figure 8A:
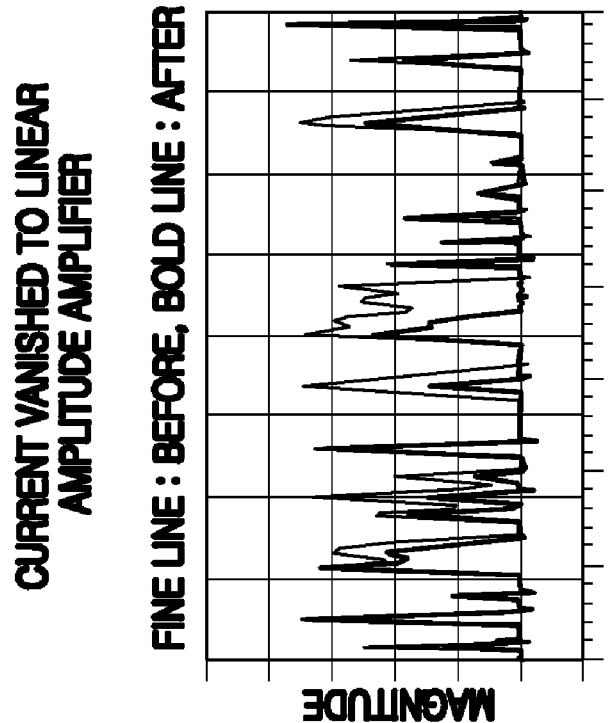

FIG. 8A shows the output current of the linear amplitude amplifier, and FIG. 8B shows the unnecessary current of the switching regulator lost to the linear amplitude amplifier.

When the bias modulator supplies the multiple divided bias voltages to the switching regulator based on the magnitude of the amplitude signal, the slew rate of the output current 700 of the switching regulator changes significantly as shown in FIG. 7B. Thus, the bias modulator can reduce the output current of the linear amplitude amplifier as shown in FIG. 8A.

Since less unnecessary current is produced by significantly changing the slew rate of the output current of the switching regulator, the current lost to the linear amplitude amplifier can be decreased as shown in FIG. 8B.

As described above, the bias modulator employs the linear amplitude amplifier and the switching regulator as the power source. The ratio of the currents of the linear amplitude amplifier and the switching regulator affects the entire efficiency of the bias modulator. For example, provided that the efficiency of the linear amplitude amplifier is 45% and the efficiency of the switching regulator is 90%, the total efficiency of the bias modulator is shown in FIG. 9.

Figure 9:
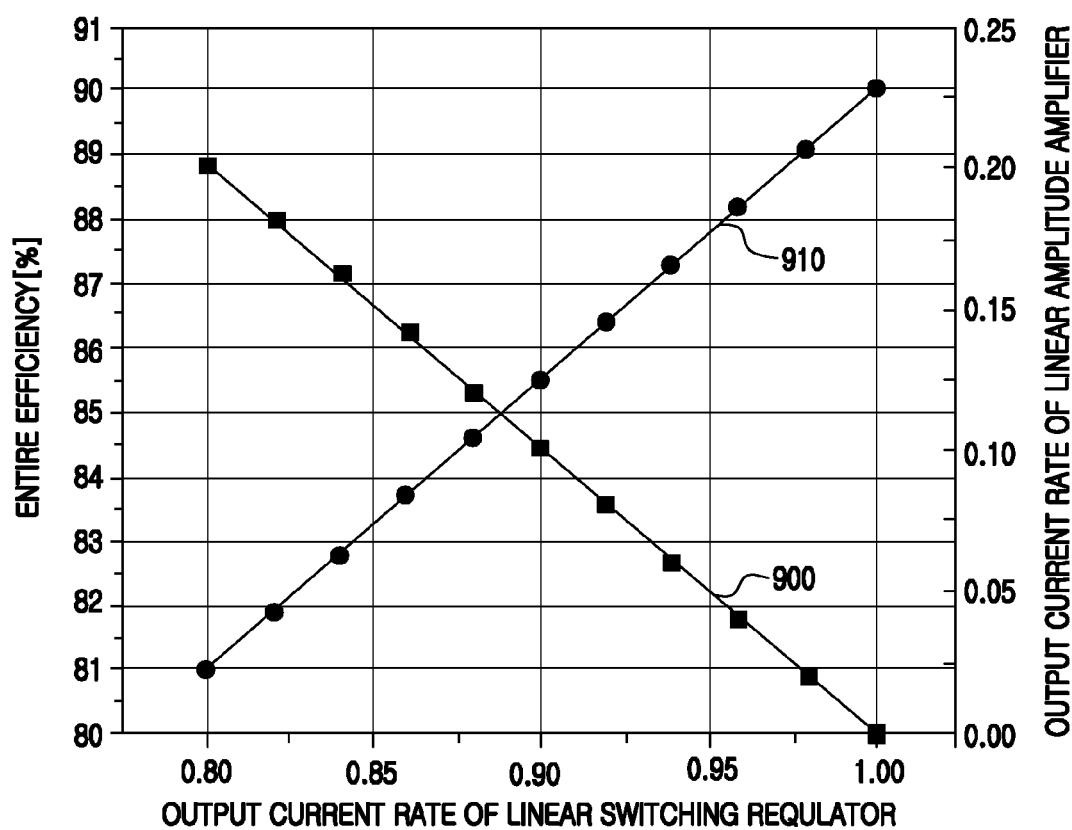
FIG. 9 illustrates a performance change of an EER power transmitter according to an exemplary embodiment of the present invention.

FIG. 9 is a graph showing the performance change of an EER power transmitter according to an exemplary embodiment of the present invention.

When the output current of the bias modulator is normalized to one (1) in FIG. 9, the sum of the rates of the currents of the linear amplitude amplifier and the switching regulator of the bias modulator is one (1) as indicated by the first graph 900.

When the ratio of the linear amplitude amplifier and the switching regulator is regulated, the efficiency of the bias modulator is yielded as indicated by the second graph 910. That is, the greater ratio of the switching regulator, the better efficiency of the bias modulator.

As set forth above, the EER power transmitter raises the ratio of the current supplied to the high-efficiency power amplifier by changing the bias voltage of the switching regulator based on the magnitude detected from the amplitude component. Therefore, the bias modulator can support the broad slew rate and the entire efficiency of the EER power transmitter can be enhanced.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus for an Envelope Elimination and Restoration (EER) power transmitter, the apparatus comprising:
    a signal separator for splitting a transmit signal into an amplitude component and a phase component;
    an orthogonal modulator for modulating the phase component into a Radio Frequency (RF) signal;
    a bias modulator for linearly amplifying the amplitude component, for determining a bias voltage according to a magnitude of the amplitude component, and for providing a current corresponding to the determined bias voltage to a high-efficiency power amplifier; and
    the high-efficiency power amplifier for amplifying the RF signal using the linearly amplified amplitude component as a drain bias voltage and using the generated current as a drain bias current.

2. The apparatus of claim 1, wherein the bias modulator comprises:
    a bias power unit comprising one or more power devices which supply bias voltages;
    a linear amplitude amplifier for linearly amplifying the amplitude component;
    a voltage dropper for reducing a voltage of the linearly amplified amplitude component;
    a magnitude detector and divider for dividing a magnitude of the voltage-dropped amplitude component into at least two voltage levels;
    a switch controller for selecting one of the one or more power devices which supplies a bias voltage corresponding to the at least two voltage levels; and
    a switching regulator for generating a current using the bias voltage of the selected one or more power devices.

3. The apparatus of claim 2, wherein the voltage dropper increases the voltage reduction when the linear amplitude amplifier supplies a greater current, and decreases the voltage reduction when at least one of the linear amplitude amplifier supplies less current and an unnecessary current supplied from the switching regulator increases.

4. The apparatus of claim 2, wherein the voltage dropper comprises a passive component connected in series to an output stage of the linear amplitude amplifier.

5. The apparatus of claim 2, wherein the magnitude detector and divider divides the magnitude of the voltage-dropped amplitude component into as many voltage levels as the bias voltages supplied by the bias power unit.

6. The apparatus of claim 2, wherein the magnitude detector and divider comprises:
    an amplifier for amplifying the voltage-dropped amplitude component; and
    a controller for dividing the magnitude of the amplified signal into as many voltage levels as the bias voltages supplied by the bias power unit, and for generating a control signal to select a power device which supplies the bias voltage corresponding to the voltage level.

7. The apparatus of claim 6, wherein the switch controller controls to connect one of the one or more power devices of the bias power unit to the switching regulator according to the control signal provided from the controller.

8. The apparatus of claim 6, wherein the controller comprises:
one or more hysteresis comparators, each having different hysteresis, for operating according to the voltage of the signal amplified by the amplifier; and
two or more control signal generators, each for generating a control signal of the one or more power devices which supply the bias voltages according to output signals of two consecutive hysteresis comparators, respectively.

9. The apparatus of claim 8, wherein each of the two or more control signal generators generate a control signal to connect one of the power devices of the bias power unit to the switching regulator by performing an exclusive OR (XOR) operation on the outputs of the two consecutive comparators.

10. The apparatus of claim 2, further comprising:
a feedback part for feeding back an input bias voltage of the switching regulator;
a delay checker for determining a delay from the magnitude detector and divider to the switching regulator using a signal fed back from the feedback part and the output signal of the magnitude detector and divider; and
a delay controller for compensating for a delay of the output signal of the magnitude detector and divider and for providing the compensated signal to the switch controller.

11. A signal transmission method of an Envelope Elimination and Restoration (EER) power transmitter, the method comprising:
splitting a transmit signal into an amplitude component and a phase component;
modulating the phase component into a Radio Frequency (RF) signal;
linearly amplifying the amplitude component;
generating a current to be used for amplifying the RF signal with a bias voltage corresponding to a magnitude of the amplitude component; and
amplifying the RF signal using the linearly amplified amplitude component as a drain bias voltage and using the generated current as a drain bias current.

12. The method of claim 11, wherein the generating of the current comprises:
dropping a voltage of the linearly-amplified amplitude component;
dividing a magnitude of the voltage-dropped amplitude component into at least two voltage levels;
selecting a bias voltage corresponding to one of the at least two voltage levels; and
generating the current using the selected bias voltage.

13. The method of claim 12, wherein the dropping of the voltage comprises:
increasing the voltage reduction when the current of the linearly amplified signal increases; and
decreasing the voltage reduction when at least one of the current of the linearly amplified signal decreases and an unnecessary current supplied from the switching regulator increases.

14. The method of claim 12, wherein the dividing of the magnitude of the voltage-dropped amplitude component into the at least two voltage levels comprises:
dividing the magnitude of the voltage-dropped amplitude component into as many voltage levels as a number of bias voltages supplied to the switching regulator.

15. The method of claim 14, wherein the dividing of the magnitude of the voltage-dropped amplitude component into the at least two voltage levels further comprises:
comparing the magnitude of the voltage dropped amplitude component to a plurality of hysteresis comparators, each having a different hysteresis; and
outputting at least one control signal corresponding to the comparison result,
wherein the number of hysteresis comparators is one more than the number of bias voltages supplied to the switching regulator.

16. The method of claim 15, wherein the outputting of the at least one control signal corresponding to the comparison result comprises:
receiving, by a control signal generator, an output from each of the plurality of hysteresis comparators; and
performing an exclusive OR (XOR) operation on the outputs of two consecutive comparators.

17. The method of claim 16, wherein the receiving, by the control signal generator, of the output from each of the plurality of hysteresis comparators comprises:
receiving, by one of a plurality of control signal generator parts, the outputs of the two consecutive comparators,
wherein the number of control signal generator parts is as many as the number of bias voltages supplied to the switching regulator.

18. The method of claim 12, wherein the dropping of the voltage of the linearly-amplified amplitude component comprises passing the output from an output stage of the linear amplitude amplifier through a passive component in series with the output stage.

* * * * *